(12) United States Patent
Bulovic et al.

(10) Patent No.: US 8,535,758 B2
(45) Date of Patent: Sep. 17, 2013

(54) MATERIALS INCLUDING SEMICONDUCTOR NANOCRYSTALS

(75) Inventors: Vladimir Bulovic, Lexington, MA (US); Seth Coe-Sullivan, Belmont, MA (US); Wing-Keung Woo, San Ramon, CA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1671 days.

(21) Appl. No.: 11/959,853

(22) Filed: Dec. 19, 2007

(65) Prior Publication Data

US 2013/0216707 A1 Aug. 22, 2013

Related U.S. Application Data

(62) Division of application No. 10/400,907, filed on Mar. 28, 2003, now Pat. No. 7,332,211.

(60) Provisional application No. 60/424,343, filed on Nov. 7, 2002.

(51) Int. Cl.
*B05D 1/34* (2006.01)
*B05D 5/00* (2006.01)

(52) U.S. Cl.
USPC ............ 427/240; 427/407.1; 427/425

(58) Field of Classification Search
USPC ............ 427/240, 425, 407.1
See application file for complete search history.

(56) References Cited

U.S. PATENT DOCUMENTS

| | | | |
|---|---|---|---|
| 3,156,369 A | 11/1964 | Bowes et al. |
| 4,515,267 A | 5/1985 | Welsh |
| 5,027,872 A | 7/1991 | Taylor et al. |
| 5,152,965 A | 10/1992 | Fisk et al. |
| 5,260,957 A | 11/1993 | Hakimi et al. |
| 5,293,050 A | 3/1994 | Chapple-Sokol et al. |
| 5,354,707 A | 10/1994 | Chapple-Sokol et al. |
| 5,419,445 A | 5/1995 | Kaesemeyer |
| 5,422,489 A | 6/1995 | Bhargava |
| 5,433,328 A | 7/1995 | Baron et al. |
| 5,505,928 A | 4/1996 | Alvisatos et al. |
| 5,525,377 A | 6/1996 | Gallagher et al. |
| 5,537,000 A | 7/1996 | Alvisatos et al. |
| 5,585,640 A | 12/1996 | Huston et al. |
| 5,613,140 A | 3/1997 | Taira |
| 5,677,545 A | 10/1997 | Shi et al. |
| 5,751,018 A | 5/1998 | Alvisatos et al. |
| 5,794,802 A | 8/1998 | Caola |
| 5,984,141 A | 11/1999 | Gibler |

(Continued)

FOREIGN PATENT DOCUMENTS

| JP | 2003/081357 | 3/2003 |
| JP | A-2003-217861 | 7/2003 |

(Continued)

OTHER PUBLICATIONS

U.S. Appl. No. 60/368,130, filed Mar. 19, 2002, Bulovic et al.

(Continued)

*Primary Examiner* — Kirsten Jolley
(74) *Attorney, Agent, or Firm* — Steptoe & Johnson LLP

(57) ABSTRACT

A composition includes a layer of nanoparticles and a layer of a second material.

17 Claims, 2 Drawing Sheets

(56) References Cited

U.S. PATENT DOCUMENTS

| | | | |
|---|---|---|---|
| 6,054,495 | A | 4/2000 | Markowitz et al. |
| 6,103,868 | A | 8/2000 | Heath et al. |
| 6,139,585 | A | 10/2000 | Li |
| 6,152,296 | A | 11/2000 | Shih et al. |
| 6,157,047 | A | 12/2000 | Fujita et al. |
| 6,207,229 | B1 | 3/2001 | Bawendi et al. |
| 6,221,416 | B1 | 4/2001 | Nohren et al. |
| 6,294,401 | B1 | 9/2001 | Jacobson et al. |
| 6,322,901 | B1 | 11/2001 | Bawendi et al. |
| 6,372,270 | B1 | 4/2002 | Denny |
| 6,379,635 | B2 | 4/2002 | O'Brien et al. |
| 6,445,009 | B1 | 9/2002 | Grandjean et al. |
| 6,447,698 | B1 | 9/2002 | Ihara et al. |
| 6,501,091 | B1 | 12/2002 | Bawendi et al. |
| 6,506,564 | B1 | 1/2003 | Mirkin et al. |
| 6,527,110 | B2 | 3/2003 | Moscovitz |
| 6,569,329 | B1 | 5/2003 | Nohren, Jr. |
| 6,576,291 | B2 | 6/2003 | Bawendi et al. |
| 6,607,829 | B1 | 8/2003 | Bawendi et al. |
| 6,644,471 | B1 | 11/2003 | Anderson |
| 6,797,412 | B1 | 9/2004 | Jain et al. |
| 6,816,525 | B2 | 11/2004 | Stintz et al. |
| 6,846,565 | B2 | 1/2005 | Korgel et al. |
| 6,864,626 | B1 | 3/2005 | Weiss et al. |
| 6,886,686 | B2 | 5/2005 | Anderson |
| 7,055,685 | B1 | 6/2006 | Patterson et al. |
| 2001/0005495 | A1 | 6/2001 | O'Brien et al. |
| 2002/0090426 | A1 | 7/2002 | Denny |
| 2003/0003300 | A1 | 1/2003 | Korgel et al. |
| 2003/0017264 | A1 | 1/2003 | Treadway et al. |
| 2003/0039777 | A1* | 2/2003 | Dalton et al. ............ 428/35.7 |
| 2003/0042850 | A1 | 3/2003 | Bertram et al. |
| 2003/0072850 | A1 | 4/2003 | Burniski |
| 2004/0200740 | A1 | 10/2004 | Cho |
| 2004/0200742 | A1 | 10/2004 | Cho |
| 2004/0265622 | A1 | 12/2004 | Sadasivan et al. |

FOREIGN PATENT DOCUMENTS

| | | |
|---|---|---|
| JP | 2004/083022 | 3/2004 |
| JP | A-2004-296950 | 10/2004 |
| JP | A-2004-303592 | 10/2004 |
| JP | A-2005-38634 | 2/2005 |
| WO | WO9610282 | 4/1996 |
| WO | WO9710175 | 3/1997 |
| WO | WO9926299 | 5/1999 |
| WO | WO 03/021694 | 3/2003 |
| WO | WO2005004253 | 1/2005 |
| WO | WO2005017951 | 2/2005 |

OTHER PUBLICATIONS

Aktsipetrov, O.A., et al. "Generation of reflected second harmonic at semiconductor quantum dots," *JETP Letters*, vol. 55, No. 8, 435-439 (1992).

Alivisatos, J. Phys. Chem., 1996, 1996, 100, 13226-13239.

Baltrameyunas, R., et al., "Fast switching of the transmission of light by glasses activated with CdS microcrystals," *Sov. Phys. Semicond.*, vol. 25 No. 2, 164-166 (1991).

Baltramiejunas, R., et al. "Rapid Processes of Darkening and Bleaching in CdS Doped Glasses," *Superlattices and Microstructures* vol. 10, No. 3, 307-310 (1990).

Bhargava, R.N., et al., "Quantum Confined Atoms of Doped ZnO Nanocrystals", *Phys. Stat. Sol* (b) 229, No. 2, 897-901 (2002).

Chamarro, M., et al., "Enhancement of electron-hole exchange interaction in CdSe nanocrystals; A quantum confinement effect," *Physical Review B*, vol. 53, No. 3, Jan. 15, 1996—I, 1336-1342.

Chamarro, M., et al., "Enhancement of Exciton Exchange Interaction by Quantum Confinement in CdSe Nanocrystals," *Jpn. J. Appl. Phys*, vol. 34, 12-14 (1994).

Chamarro, M., et al., "Size-dependent Electron-Hole Exchange Interaction in CdSe Quantum Dots, *Il Nuovo Cimento*," vol. 17, Nos. 11-12, (1995) 1407-1412.

Chepic, D.I., et al.. "Auger ionization of semiconductor quantum drops in a glass matrix," *Journal of Luminescence* 47 (1990) 113-127 North-Holland.

Coe, et al., Nature, 2002, 420, 19.

Colvin et al., Nature, 1994, 370, 6488, 354-357.

Dabbousi, B. et al., J. Phys. Chem. B, 1997, 101, 9463.

Dabbousi, et al., Appl. Phys. Lett., 1995, 66, 11, 1316-1318.

Danek, et al., Chem. Mater. 1996, 8, 1, 173-180.

Diehl, et al., III-Vs Rev., 1997, 10, 1.

Dneproviskii, V.S., et al., "Time-Resolved Luminescence of CdSe Microcrystals," *Solid State Communications*, vol. 74, No. 7, pp. 555-557, 1990.

Edamatsu, K., et al., "Subpicosecond dynamics of confined excitons and optical nonlinearities of CuCl quantum dots," *Journal of Luminescence* 66 & 67 (1996) 406-409.

Efros, A.L., et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A. I., et al., "Absorportion and intensity-dependent photoluminescence measurements on CdSe quantum dots: assignment of the first electronic transitions," *Journal of the Optical Society of America*, vol. 10, Nos. 1-12, 100-107 (1992).

Ekimov, A.I. et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Ekimov, A.I. et al.. "Spectra and Decay Kinetics of Radiative Recombination in CdS Microcrystals," *Journal of Luminescence* 46 (1990) 83-95 North-Holland.

Ekimov, A.I. et al., "Growth of CdSe nanocrystals in ion-implanted $SiO_2$ films," *Journal of Crystal Growth* 151 (1995) 38-45.

Ekimov, A.I. et al., "Donor-like Exciton in Zero-Dimension Semiconductor Structures," *Solid State Communications*, vol. 69, No. 5, pp. 565-568, 1989.

Ekimov, A.I. et al., "Growth and optical properties of semiconductor nanocrystals in a glass matrix," *Journal of Luminescence* 70 (1996) 1-20.

Ekimov, A.I. et al., "Influence of high hydrostatic pressures on the exciton spectrum of CdS microcrystals in glass," *Sov. Phys. Semicond.* 23(9), Sep. 1989, pp. 965-966.

Ekimov, A.I. et al., "Nonlinear Optics of Semiconductor-Doped Glasses," *Phys. Stat. Sol.* (b) 150, (1988) pp. 627-633.

Ekimov, A.I. et al.. "Optical Properties of Oxide Glasses Doped by Semiconductor Nanocrystals," *Radiation Effects and Defects in Solids*, 1995, vol. 134, pp. 11-22.

Ekimov, A.I. et al., "Optical Properties of Semiconductor Quantum Dots in Glass Matrix," *Physica Scripta*. vol. T39, 217-222 (1991).

Ekimov, A.I. et al., "Optics of Zero Dimensional Semiconductor Systems, *Acta Physica Polonica A*," vol. 79 (1991), No. 1. pp. 5-14.

Ekimov, A.I. et al., "Photoluminescence of quasizero-dimensional semiconductor structures," *Sov. Phys. Solid State* 31(8), Aug. 1989, pp. 1385-1393.

Ekimov, A.I. et al., "Quantization of the energy spectrum of holes in the adiabatic potential of the electron," *JETP Lett.*, vol. 43, No. 6, Mar. 25, 1986, pp. 376-379.

Ekimov, A.I. et al., "Quantum Size Effect in Semiconductor Microcrystals," *Solid State Communications*, vol. 56, No. 11, pp. 921-924, 1985.

Ekimov, A.I. et al., "Quantum size effect in the optical spectra of semiconductor microcrystals," *Sov. Phys. Semicond.* 16(7), Jul. 1982, pp. 775-778.

Ekimov, A.I. et al., "Quantum size effect in three-dimensional microscopic semiconductor crystals," *JETP Lett*, vol. 34, No. 6, Sep. 20, 1981, pp. 345-349.

Ekimov, A.I. et al., "Quantum-Size Stark Effect in Semiconductor Microcrystals," *Journal of Luminescence* 46 (1990) 97-100 North-Holland.

Ekimov, A.I. et al., "Size quantization of the electron energy spectrum in a microscopic semiconductor crystal," *JETP Lett.*, vol. 40, No. 8, Oct. 25, 1984, pp. 1136-1139.

Empedocles, et al., Phys. Rev. Lett., 1996, 77, 18, 3873-3876.

Empedocles, et al., Science, 1997, 278, 2114-2117.

Grabovskis, V.Y., et al., "Photoionization of semiconducting microcrystals in glass," *Sov. Phys. Solid State* 31(1), Jan. 1989, pp. 149-151.

Guha, et al., J. Appl. Phys., 1997, 82, 8, 4126-4128.

Gurevich, S.A., et al. "Preparation and investigation of SiO$_2$ films activated by CdS semiconductor nanocrystals," *Soviet Physics Semiconductors*, vol. 26, 57-59 (1992).

Gurevich, S.A., et al., "Growth of CdS nanocrystals in silicate glasses and in thin SiO$_2$ films in the Initial states of the phase separation of a solid solution," *Semiconductors*, 28 (5), May 1994, 486-493.

Hines, et al., J. Phys. Chem, 1996, 100, 468.

Itoh, T. et al., "Interface effects on the properties of confined excitons in CuCl microcrystals," *Journal of Luminescence* 60 & 61 (1994) 396-399.

Itoh, T., et al., "Polaron and Exciton-Phonon Complexes in CuCl Nanocrystals," *Physical Review Letters*, vol. 74, No. 9, Feb. 27, 1995, p. 1645-1648.

Itoh, T., et al., "Subpicosecond dynamics of confined excitons in CuCl nanocrystals," *Materials Science and Engineering* A217/218 (1996) 167-170.

Jursenas, S., et al., "Surface Recombination of Nonequilibrium Electron-Hole Plasma in Laser-Modified Semiconductor-Doped Glasses," *Solid State Communications*, vol. 87, No. 6, 577-580 (1993).

Kagan et al., Phys. Rev. B, 1996, 54, 12, 8633-8643.

Kagan et al., Phys. Rev. Lett., 1996, 76, 9, 1517-1520.

Kortan et al., J. Am. Chem. Soc., 1990, 112, 1327-1332.

Kuno, et al., J. Chem. Phys., 1997, 106, 23, 9869-9882.

Lawless, et al., J. Phys. Chem., 1995, 99, 10329-10335.

Leatherdale, et al., Phys. Rev. B, 2000, 62, 4, 2669-2680.

Lublinskaya, O., et al.. "CdS nanocrystal growth in thin silica films: evolution of size distribution function", *Journal of Crystal Growth* 184/185 (1998) 360-364.

Masumoto, et al., J. Phys. Chem., 1996, 100, 32, 13781-13785.

Murray, C. et al., Ann. Rev. Mat. Sci., 2000, 30, 545-610.

Murray, C. et al., J. Amer. Chem. Soc., 1993, 115, 8706.

Nirmal, et al., Nature, 1996, 383, 802-804.

Saviot, L., et al., "Effects of Resonance on Low-Frequency Raman Scattering From Semiconductor Nanocrystals," *Radiation Effects and Defects in Solids*, 1995, vol. 137, pp. 45-50.

Saviot, L., et al., "Size dependence of acoustic and optical vibrational modes of CdSe nanocrystals in glasses," *Journal of Non-Crystalline Solids* 197 (1996) 238-246.

Saviot, L., et al., "Size-selective resonant Raman scattering in CdS doped glasses," *Physical Review B*, vol. 57, No. 1, Jan. 1, 1998—I, 341-346.

Schlamp et al., J. Appl. Phys., 1997, 82, 11, 5837-5842.

Sirenko, A.A., et al., "Spin-flip and acoustic-phonon Raman scattering in CdS nanocrystals", *Physical Review B*, vol. 58, No. 4, 15 (Jul. 1998—II), 2077-2087.

Spanhel, et al., J. Am. Chem. Soc., 1987, 109, 19, 5649-5655.

Tamulaitis, G., et al., "Dynamics of Nonlinear Optical Response of CuBr-Doped Glasses," *Superlattices and Microstructures*, vol. 3, No. 2, 199-202 (1993).

Valenta, J., et al., "Dynamics of excitons in CuBr nanocrystals: Spectral-hole burning and transient four-wave-mixing measurements," *Physical Review B*, vol. 57, No. 3, Jan. 15, 1998—I, 1774-1783.

Vandyshev, Y.V., et al., "Nonlinear optical properties of semiconductor microcrystals," *JETP Lett.*, vol. 46, No. 10, Nov. 25, 1987 pp. 435-439.

Volkov, A.S., et al., "Oscillations of polarization of recombination radiation of a variable gap semiconductor in a magnetic field," *JETP Lett.*, vol. 25 No. 55, 526-528 (1977).

\* cited by examiner

MATERIALS INCLUDING SEMICONDUCTOR NANOCRYSTALS

CLAIM OF PRIORITY

This application is a divisional of U.S. patent application Ser. No. 10/400,907, filed on Mar. 28, 2003 claims priority under 35 USC §119(e) to U.S. Patent Application Ser. No. 60/424,343, filed on Nov. 7, 2002, the entire contents of which are hereby incorporated by reference.

FEDERALLY SPONSORED RESEARCH OR DEVELOPMENT

The U.S. Government may have certain rights in this invention pursuant to Grant No. DMR-9400334 from the National Science Foundation.

TECHNICAL FIELD

The present invention relates to materials including nanoparticles.

BACKGROUND

In general, a composite is a material that contains two or more components. Each component can contribute unique properties to the composite. As a result, the composite can have the advantageous properties of each component, all of which would not be present in a material that is lacking one of the components. Some composite materials can be particularly well-suited for use, for example, in optical, electronic, optoelectronic, magnetic, or catalytic applications.

SUMMARY

A composition can include a matrix material and a plurality of nanoparticles phase separated from the matrix material. The matrix material can form a layer. The layer can be discontinuous. The plurality of nanoparticles can form a layer contacting the matrix material. The layer of nanoparticles can be discontinuous.

A method of manufacturing a layered device can include depositing a film-forming solution on a substrate to form two layers from the film-forming solution, the film-forming solution including a first material and a second material. The first material includes a matrix material and the second material includes a plurality of nanoparticles. One layer can be a discontinuous or continuous layer including the nanoparticles.

The matrix can be non-polymeric. The nanoparticle can be a nanocrystal. The nanoparticles can be metallic nanoparticles, ceramic nanoparticles, or semiconductor nanoparticles, such as semiconductor nanocrystals. The plurality of nanoparticles can be a substantially monodisperse population of semiconductor nanoparticles.

In another aspect, a method of forming a layered structure includes selecting a matrix material and a nanoparticle which are mutually immiscible, dissolving the matrix material and the nanoparticle in a solvent to form a coating solution, and coating a substrate with the coating solution. Coating the substrate with the coating solution can include spin coating. The nanoparticle can be a semiconductor nanoparticle, a metallic nanoparticle, or a ceramic nanoparticle. The nanoparticle can be one of a plurality of nanoparticles forming a monolayer on a layer of the matrix material.

Typical conventional thin film deposition of solvated materials involves spin-casting of individual materials to form a multilayered (e.g., bilayered) structure. The disadvantages inherent to the spin-casting process to form a multilayered structure are due to the presence of the solvent. For example, in order to deposit a multilayered structure using spin-casting, care must be taken to choose a solvent of the overlayer to avoid dissolving the underlying film. By using phase segregation, bilayered or other multilayered structures can be manufactured in a single film deposition step.

The material can include greater than 0.001%, greater than 0.01%, greater than 0.1%, greater than 1%, greater than 5%, greater than 10%, greater than 50%, or greater than 90% by volume nanoparticles. The material can form a layer of a light emitting device. Light emitting devices including semiconductor nanocrystals are described, for example, in U.S. Application No. 60/368,130, filed Mar. 29, 2002, which is incorporated by reference in its entirety.

Metallic nanoparticles can be prepared as described, for example, in U.S. Pat. No. 6,054,495, which is incorporated by reference in its entirety. The metallic nanoparticle can be a noble metal nanoparticle, such as a gold nanoparticle. Gold nanoparticles can be prepared as described in U.S. Pat. No. 6,506,564, which is incorporated by reference in its entirety. Ceramic nanoparticles can be prepared as described, for example, in U.S. Pat. No. 6,139,585, which is incorporated by reference in its entirety.

Narrow size distribution, high quality semiconductor nanocrystals with high fluorescence efficiency are first prepared using previously established literature procedures and used as the building blocks. See, C. B. Murray et al., J. Amer. Chem. Soc. 1993, 115, 8706, B. O. Dabbousi et al., J. Phys. Chem. B 1997, 101, 9463, each of which is incorporated by reference in its entirety. The organic, surface-passivating ligands are then exchanged to stabilize the nanocrystals in polar solvents and in the matrix. The each of the plurality of semiconductor nanocrystals includes a same or different first semiconductor material. Each first semiconductor material can be overcoated with a second semiconductor material. Each first semiconductor film has a first band gap and each second semiconductor material has a second band gap. The second band gap can be larger than the first band gap. Each nanocrystal can have a diameter of less than about 10 nanometers. The plurality of nanocrystals can have a monodisperse distribution of sizes.

Other features, objects, and advantages will be apparent from the description and drawings, and from the claims.

DETAILED DESCRIPTION

Figure 1:
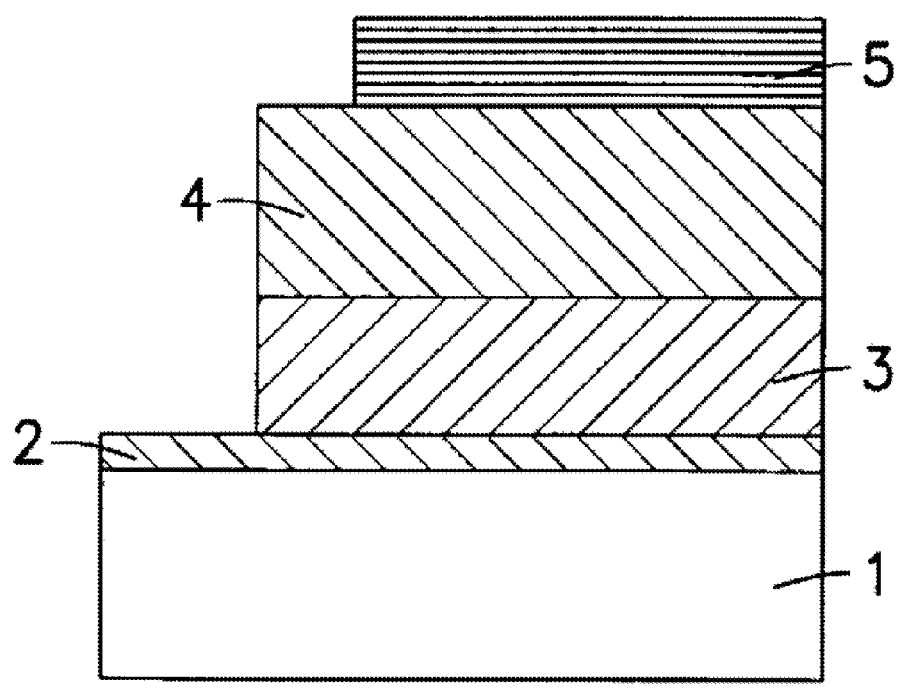
FIG. 1 is a schematic drawing depicting a light-emitting device.

Chemically synthesized colloidal nanoparticles (nanoparticles), such as semiconductor nanocrystals or quantum dots, consist of 1-10 nm diameter particles decorated with a layer of organic ligands. See, C. B. Murray et al., *Annu. Rev. Mat. Sci.*, 30, 545-610 (2000), which is incorporated in its entirety. These zero-dimensional structures show strong quantum confinement effects that can be harnessed in designing bottom-up chemical approaches to create complex heterostructures with electronic and optical properties that are tunable with the size of the nanocrystals. At the same time, as a result of the surrounding ligand shell, nanocrystals can be chemically manipulated as large molecules.

The chemical properties of the surrounding ligand shell can make the nanoparticles soluble within or reactive with a matrix material. The matrix material can be an inorganic material or an organic material. The surrounding ligand shell has exposed ligand moieties. When the exposed ligand moieties are chemically similar to the matrix material, the nanoparticles are soluble in the matrix. When the exposed ligand moieties and matrix material are chemically dissimilar, the nanoparticles are not soluble within the matrix. The ligand moieties can have the formula:

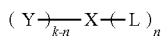

wherein k is 2, 3 or 5, and n is 1, 2, 3, 4 or 5 such that k−n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond, the hydrocarbon chain being optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl and the hydrocarbon chain being optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or P(O)(R$^a$)—; and each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety.

When the exposed ligand moieties and the matrix material are chemically dissimilar, a phase segregated material can be produced. The nanoparticles having the ligand shell with exposed ligand moieties and a chemically dissimilar matrix material can be dissolved in a mutual solvent to generate a film-forming solution. The solution can be deposited on a substrate, for example, by drop coating, dip coating or spin coating, to form a film. When dried, the film contains a layer of matrix material and a layer of nanoparticles. Either layer may be discontinuous, depending on the concentration of the nanoparticles or matrix material in the film-forming solution. For example, if the nanoparticles form a discontinuous layer, the nanoparticles form islands of a higher concentration of nanoparticles contacting a continuous layer of matrix material. In this manner, multiple layers are formed in a single film-forming deposition step.

Material phase segregation can be used to create a spin-cast thin film bilayer structure. The chemical characteristics of the two components are chosen so that layered phase segregation results. For example, a bilayer structure consisting of a bottom layer of N,N'-diphenyl-N,N'-bis(3-methylphenyl)-1,1'-biphenyl-4,4'-diamine (TPD) is covered with a layer of self-assembled colloidal semiconductor nanocrystals as a monolayer. The TPD consists in large part of aromatic groups, while the nanoparticles have a ligand shell that exposes a surface which mostly consists of alkyl chains (trioctylphosphine/trioctylphosphine oxide). There can also be a large size difference between the molecular matrix, typically about 1 nm or less, and the colloidal nanoparticles, typically greater than 3 nm. While this example employs aromatic/aliphatic chemical pairs, any pair of moieties or functional groups can be used such that phase separation will occur. For example, nanoparticles that would display a highly polar surface (e.g. OH groups) can phase separate in a layered film upon spin-coating if the other molecule is mostly non-polar. The bilayer structure can used to fabricate efficient light emitting devices (LEDs).

The solubility of the nanoparticles and matrix material in the solvent can be on the order of 10 mg/mL to allow for a large range of possible solution mixtures and film thicknesses. Additionally, the matrix material can be selected to maximize phase segregation with the nanoparticles.

When the material is included in a light emitting device, the device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light.

A light emitting device can have a structure such as shown in FIG. 1, in which a first electrode 2, a first layer 3 in contact with the electrode 2, a second layer 4 in contact with the first layer 3, and a second electrode 5 in contact with the second layer 4. First layer 3 can be a hole transporting layer and second layer 4 can be an electron transporting layer. Alternatively, a separate emissive layer (not shown in FIG. 1) can be included between the hole transporting layer and the electron transporting layer. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of nanoparticles, for example, a substantially monodisperse population of nanoparticles. Alternatively, a separate emissive layer can include the plurality of nanoparticles.

Emission from semiconductor nanocrystals can occur at an emission wavelength when one or more of the nanocrystals is excited. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases.

Semiconductor nanocrystals can have high emission quantum efficiencies such as greater than 10%, 20%, 30%, 40%, 50%, 60%, 70%, or 80%. The semiconductor forming the nanocrystals can include Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, which is incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl)pnictide. Suitable X donors include dioxygen, bis(trimethylsilyl)selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine)sulfide (TOPS), an ammonium salt such as an ammonium halide (e.g., $NH_4Cl$), tris(trimethylsilyl)phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Layers including nanocrystals can be formed by redispersing the powder semiconductor nanocrystals described above in a solvent system and drop casting films of the nanocrystals from the dispersion. The solvent system for drop casting depends on the chemical character of the outer surface of the nanocrystal, i.e., whether or not the nanocrystal is readily dispersible in the solvent system. The drop cast films are dried in an inert atmosphere for about 12 to 24 hours before being dried under vacuum. Typically, the films are formed on substrates.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

Nanocrystals of CdSe coated with a ZnS passivation layer can have photoluminescence quantum efficiencies of as high as 50%, matching that of the best organic lumophores. See, for example, Hines et al., J. Phys. Chem. 100, 468 (1996), which is incorporated by reference in its entirety. By changing the diameter of the CdSe core from 23 to 55 Å, the luminescence wavelength can be precisely tuned from 470 nm to 640 nm with a typical spectral full width at half of maximum (FWHM) of less than 40 nm. See, for example, Dabbousi et al., J. Phys. Chem. 101, 9463 (1997), which is incorporated by reference in its entirety. The narrow FWHM of nanocrystals can result in saturated color emission. This can lead to efficient nanocrystal-light emitting devices even in the red and blue parts of the spectrum, since in nanocrystal emitting devices no photons are lost to infrared and UV emission. The broadly tunable, saturated color emission over the entire visible spectrum of a single material system is unmatched by any class of organic chromophores. Furthermore, environmental stability of covalently bonded inorganic nanocrystals suggests that device lifetimes of hybrid organic/inorganic light emitting devices should match or exceed that of all-organic light emitting devices, when nanocrystals are used as luminescent centers. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The nanocrystal's excited state lifetime (t) is much shorter ($\tau \approx 10$ ns) than a typical phosphor ($\tau > 0.5$ µs), enabling nanocrystal-light emitting devices to operate efficiently even at high current density.

The choice of organic host for the nanocrystals is limited by material deposition methods. CdSe nanocrystals are typically arranged into thin films by spin-casting from solution. While spin-casting is possible for molecular organics, and typical for polymer organics, it limits the available organic matrix materials to those that are highly soluble in solvents such as toluene, hexanes and chloroform, which are the preferred solvents for the TOPO capped nanocrystal colloids. In order to have a large range of possible solution mixtures and film thicknesses, it is necessary to have organic solubility in the range of 10 mg/mL. Such is the case for TPD in chloroform. TPD has the added advantage of being a blue emitting material, which can facilitate access to the entire visible spectrum by doping different sized nanocrystals into this organic matrix.

In one example of forming a bilayer, TPD and nanocrystals can be dispersed in a suitable solvent (chloroform in this case); the mixed solution is spin-cast on top of pre-cleaned ITO substrates. The phenyl/benzyl groups of the TPD and the alkyl groups covering the nanocrystal surfaces cause the two materials to phase segregate and result in the formation of a TPD/nanocrystal bilayer structure while the chloroform evaporates. The spin-casting is performed in a controlled (oxygen-free and moisture-free) environment in order to obtain highly reproducible heterostructures. Appropriate layer(s) of molecular organics followed by the metal electrode layers are then deposited via thermal evaporation. The self-assembled nanocrystal monolayer can be positioned in the recombination zone of the multilayer active organic electroluminescent device. Confinement of nanocrystals to the device active region maximizes the efficiency of nanocrystals material usage.

The process is very general. For example, controlled phase separation has been successful with CdSe, CdSe(ZnS), and PbSe nanocrystals with TOPO capping ligands, and oleic acid capping ligands. The matrix of the controlled phase separated structures can be organic molecules, such as N,N'-di-[(1-naphthalenyl)-N,N'-diphenyl]-1,1'-biphenyl)-4,4'-diamine (NPD) and TPD, as well as a polymerized version of TPD. Controlled phase separation has been successful using different solvents, including chloroform and chlorobenzene. Changing the size of the nanocrystals, for example, from 3 nm to 9 nm continued to result in efficient phase separation. In terms of controlling the process, lower vapor pressure solvents, which take longer to evaporate during spin coating, increase the degree of order found on the monolayer film of nanocrystals. For example, the nanocrystals can become hexagonally packed. Also, very narrow size distributions of nanocrystals increase the degree of observed hexagonal ordering in the nanocrystal layer.

Figure 2:
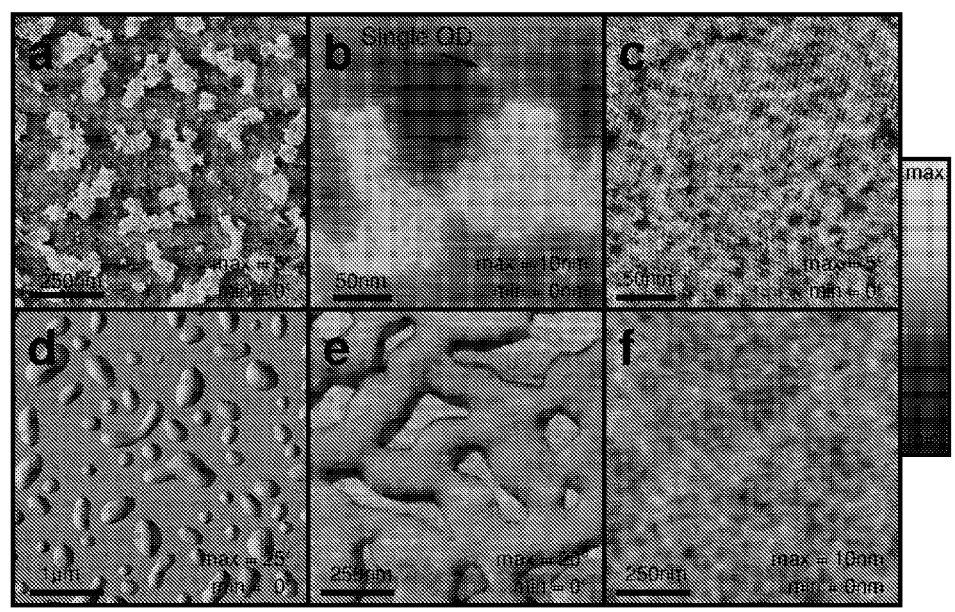
FIGS. 2A-2F are atomic force microscopy (AFM) images showing the surface morphology of various organic/nanoparticle films. a) Phase image of a partial monolayer of nanocrystals on N,N'-diphenyl-N,N'-bis(3-methylphenyl)-(1,1'-biphenyl)-4,4'-diamine (TPD) after phase segregation during spin-coating. Nanoparticle surface coverage is 21%. b) Height image of a close-up of (a) showing both an island of nanoparticles as well as individual nanoparticles on a flat TPD background. c) Phase image of a complete, hexagonally packed monolayer of nanoparticles phase segregated from the underlying TPD. Grain boundaries between ordered domains of nanoparticles are observable. d) Phase image of TPD and nanoparticles after thermal evaporation of nominal 5 nm of TPD onto the complete nanoparticle layer of (c). Material phase segregation results in TPD droplet formation. e) Phase image of nominal 10 nm of 3-(4-biphenylyl)-4-phenyl-5-tert-butylphenyl-1,2,4-triazole (TAZ) on surface similar to (c). TAZ surface coverage is 72%. f) Height image of nominal 40 nm of Alq$_3$ on surface similar to (c). Coverage is complete, with an rms surface roughness of 0.56 nm.

Nanocrystal concentration can be adjusted to form a complete single monolayer on top of a TPD film that is ~36 nm thick. Atomic force microscopy (AFM) images in FIGS. 2A and 2B show the result of spinning at ⅕ of the optimal concentration for a single monolayer, and confirm that TPD and nanocrystals do phase segregate during the spinning process, yielding a coverage of 21%. FIG. 2C shows a complete nanocrystal monolayer on a TPD film. Absorption measurements of these bilayers confirm that all of the nanocrystals are accounted for by this self-assembled, phase segregated monolayer. More particularly, FIGS. 2A-C are AFM images showing the surface morphology of various organic/nanocrystal films. a) Phase image of a partial monolayer of nanocrystals on TPD after phase segregation during spin-coating. Nanocrystal surface coverage is 21%. b) Height image of a close-up of (a) showing both an island of nanocrystals as well as individual nanocrystals on a flat TPD background. c) Phase image of a complete, hexagonally packed monolayer of nanocrystals phase segregated from the underlying TPD. Grain boundaries between ordered domains of nanocrystals are observable.

Optical absorption measurements of these bilayers indicate that nanocrystals make up 5-10% by volume of the 40 nm thick films, confirming that all of the nanocrystals are accounted for by this self-assembled, phase segregated monolayer. Further confirmation of the phase segregation process is shown in FIG. 2D, where after thermal evaporation of 5 nm of TPD onto the nanocrystal monolayer the TPD forms droplets rather than a planar thin film. Thicker organic overlayers can be planar, as in FIG. 2F, which shows the smooth surface of the 40 nm thick tris-(8-hydroxyquinoline) aluminum ($Alq_3$) overlayer in a device similar to that shown in FIG. 1.

In such a device, holes are injected from the indium tin oxide (TTO) contact into the TPD host matrix and are transported towards the single nanocrystal monolayer. Similarly, electrons are injected from the Mg:Ag cathode into the $Alq_3$ and are transported to the nanocrystals. Exciton generation on nanocrystals occurs via two parallel processes: direct charge injection and exciton energy transfer from organic molecules. For direct charge injection, electrons may be trapped at the nanocrystals due to the relative energy alignment of the lowest unoccupied molecular orbital (LUMO) levels of TPD, $Alq_3$, and the nanocrystals. For these charged nanocrystals the barrier to hole injection from the TPD is reduced. Upon acceptance of holes from TPD, excitons form on the nanocrystals, and can subsequently recombine radiatively. Alternatively, excitons can be formed on organic molecules that are near grain boundaries, interstitial spaces, and voids in the single nanocrystal monolayer. These excitons can then energy transfer to the lower energy nanocrystal sites, where they recombine radiatively.

Although we observed the energy transfer process in the photoluminescence (PL) studies of TPD/nanocrystal films, the nanocrystal-LED current-voltage data suggests generation of excitons on QDs via direct charge injection. Comparing the current-voltage characteristics of the device with that of a control structure, without the monolayer of nanocrystals, shows that the nanocrystal-LED operates at a consistently higher voltage. The nanocrystal monolayer, therefore, inhibits charge conduction, which suggests charge trapping on nanocrystal sites. For devices with nanocrystal layer thicker than a single monolayer, the operating voltage increases further while the quantum efficiency is dramatically reduced. This is consistent with the low efficiency and the high operating voltage measured in earlier studies that examined nanocrystal-LEDs containing more than 10 layers of nanocrystals. Indeed, charge trapping at nanocrystal sites has been observed in recent luminescence quenching studies of charged nanocrystals. In addition, devices that have only a partial monolayer of nanocrystals have emission spectra that are dominated by $Alq_3$ or TPD, indicating that precise control of the assembly of a nanocrystal monolayer can be important to device operation.

Sheets of single nanocrystal monolayers, square centimeters in size, can be employed in electrically active devices, minimizing nanocrystal material use to the active device region. The material phase segregation that governs formation of the organic/nanocrystal spin-cast thin film bilayers is a general and widely applicable fabrication process. The process is governed by the physical size and chemical character of the two solvated constituents; the TPD molecules are small (~1 nm) and have aromatic character, while the nanocrystals are large in comparison (>3 nm) and present a surface that consists of mostly alkyl chains. In general, phase segregation is not limited to aromatic/aliphatic pairs, but governs the interaction between any pair of materials with disparate chemical functionality.

Other embodiments are within the scope of the following claims.

What is claimed is:

1. A method of manufacturing a layered device comprising:
    depositing a film-forming solution on a substrate to form two layers from the film-forming solution, the film-forming solution including a first material and a second material, wherein the first material includes a matrix material and the second material includes a plurality of nanoparticles; and
    forming a bilayer structure from the single film-forming solution by phase segregation, wherein the bilayer structure includes a layer of the first material including the matrix material and a layer of the second material including the plurality of nanoparticles.

2. The method of claim 1, wherein one layer is a discontinuous layer including the nanoparticles.

3. The method of claim 1, wherein one layer is a continuous layer including the nanoparticles.

4. The method of claim 1, wherein the plurality of nanoparticles is a plurality of semiconductor nanoparticles.

5. The method of claim 1, wherein the plurality of nanoparticles is a plurality of metallic nanoparticles.

6. The method of claim 1, wherein the plurality of nanoparticles is a plurality of ceramic nanoparticles.

7. The method of claim 1, wherein the layer of the second material including a plurality of nanoparticles is a monolayer.

8. The method of claim 1, wherein the matrix material is non-polymeric.

9. The method of claim 1, wherein each nanoparticle has a ligand bonded to its surface having the formula:

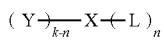

wherein k is 2, 3 or 5, and n is 1, 2, 3, 4 or 5 such that k−n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)($R^a$)—; and each of $R^a$ and $R^b$, independently, is hydrogen, alkyl, alkenyl, alkynyl, alkoxy, hydroxylalkyl, hydroxyl, or haloalkyl.

10. A method of forming a layered structure comprising:
   selecting a matrix material and a plurality of nanoparticles which are mutually immiscible;
   dissolving the matrix material and the plurality of nanoparticles in a solvent to form a coating solution;
   coating a substrate with the coating solution, and
   forming a bilayer structure from the coating solution by phase segregation wherein the bilayer structure includes a monolayer of the plurality of nanoparticles on a layer of the matrix material.

11. The method of claim 10, wherein coating the substrate with the coating solution includes spin coating.

12. The method of claim 10, wherein the nanoparticle is a semiconductor nanoparticle.

13. The method of claim 10, wherein the nanoparticle is a metallic nanoparticle.

14. The method of claim 10, wherein the nanoparticle is a ceramic nanoparticle.

15. A method of manufacturing a layered device comprising:
   depositing a film-forming solution including a first material and a second material on a substrate to form two layers from the film-forming solution, a layer of the first material and a layer of the second material, wherein the first material includes a matrix material and the second material includes a plurality of nanoparticles; and
   wherein the layer of the second material including a plurality of nanoparticles is a monolayer.

16. The method of claim 15, wherein one layer is a discontinuous layer including the nanoparticles.

17. The method of claim 15, wherein the plurality of nanoparticles is a plurality of semiconductor nanoparticles.

* * * * *